(12) United States Patent
Kajakine et al.

(10) Patent No.: US 8,369,467 B2
(45) Date of Patent: Feb. 5, 2013

(54) AUTOMATIC GAIN CONTROL SYSTEM

(75) Inventors: Nikolai Kajakine, Helsinki (FI); Arne Birger Husth, Hellerup (DK)

(73) Assignee: Nokia Corporation, Espoo (FI)

( * ) Notice: Subject to any disclaimer, the term of this patent is extended or adjusted under 35 U.S.C. 154(b) by 895 days.

(21) Appl. No.: 12/413,533

(22) Filed: Mar. 28, 2009

(65) Prior Publication Data

US 2010/0046679 A1 Feb. 25, 2010

(51) Int. Cl.
*H04B 14/06* (2006.01)
(52) U.S. Cl. ......... 375/345; 375/316; 330/129; 330/254
(58) Field of Classification Search ................... 375/345, 375/316; 330/129, 254
See application file for complete search history.

(56) References Cited

U.S. PATENT DOCUMENTS

| | | | |
|---|---|---|---|
| 7,091,792 B2* | 8/2006 | Mehr | 330/305 |
| 7,227,916 B2* | 6/2007 | Ruelke et al. | 375/345 |
| 7,366,263 B2* | 4/2008 | Terao | 375/345 |
| 7,372,925 B2* | 5/2008 | Pipilos | 375/345 |
| 7,577,414 B2* | 8/2009 | Mehr | 455/234.1 |
| 7,623,601 B2* | 11/2009 | Khoini-Poorfard et al. | 375/345 |
| 7,701,371 B2* | 4/2010 | Krishnamoorthi et al. | 341/139 |
| 7,805,121 B2* | 9/2010 | Kimura et al. | 455/232.1 |
| 7,822,153 B2* | 10/2010 | Song et al. | 375/345 |
| 8,139,544 B1* | 3/2012 | Webster et al. | 370/334 |
| 2001/0053680 A1* | 12/2001 | Yamanaka et al. | 455/232.1 |
| 2002/0163979 A1 | 11/2002 | Takatz et al. | |
| 2003/0025623 A1 | 2/2003 | Brueske et al. | |
| 2003/0027537 A1* | 2/2003 | Kimura | 455/232.1 |
| 2003/0058968 A1* | 3/2003 | Thomson et al. | 375/340 |
| 2005/0174274 A1* | 8/2005 | Delanghe et al. | 341/139 |
| 2005/0250462 A1 | 11/2005 | Wu et al. | |
| 2005/0276358 A1* | 12/2005 | Pipilos | 375/345 |
| 2006/0176093 A1* | 8/2006 | Song et al. | 327/179 |
| 2006/0222116 A1 | 10/2006 | Hughes et al. | |
| 2006/0222118 A1* | 10/2006 | Murthy et al. | 375/345 |
| 2007/0098100 A1 | 5/2007 | Charbit et al. | |

(Continued)

FOREIGN PATENT DOCUMENTS

GB 2380341 A 4/2003
WO 2007/096732 A2 8/2007

OTHER PUBLICATIONS

Search Report received for corresponding United Kingdom Patent Application No. 0805685.5, dated Jul. 24, 2009, 4 pages.

(Continued)

*Primary Examiner* — Daniel Washburn
*Assistant Examiner* — Santiago Garcia
(74) *Attorney, Agent, or Firm* — Harrington & Smith

(57) ABSTRACT

A received signal is amplified in an amplifier to create an amplified signal. The amplified signal is then filtered. The power of permanent common pilot sub-carriers present in the filtered amplified signal is calculated. A wideband power measurement is determined based on the amplified signal, and a narrowband power measurement is determined based on the filtered amplified signal. The first gain for the amplifier is controlled in dependence on the calculated power of the permanent common pilot sub-carriers, the wideband power measurement and the narrowband power measurement. The power of the permanent common pilot sub-carriers may be calculated in the frequency domain to mitigate fast switching of the controlled first gain. The filtered amplified signal may be amplified in a further amplifier, and a second gain can be controlled for the further amplifier in dependence on the calculated power of the permanent common pilot sub-carriers, the wideband power measurement and the narrowband power measurement.

17 Claims, 10 Drawing Sheets

U.S. PATENT DOCUMENTS

| | | | |
|---|---|---|---|
| 2007/0110193 A1* | 5/2007 | Solum | 375/345 |
| 2007/0139113 A1* | 6/2007 | Ra et al. | 330/254 |
| 2007/0188361 A1* | 8/2007 | Delanghe et al. | 341/118 |
| 2007/0229340 A1* | 10/2007 | Krishnamoorthi et al. | 341/155 |
| 2007/0280362 A1* | 12/2007 | Lin et al. | 375/260 |
| 2009/0097445 A1* | 4/2009 | Moelker et al. | 370/329 |
| 2009/0137212 A1* | 5/2009 | Belotserkovsky | 455/77 |
| 2010/0009646 A1* | 1/2010 | Mevel et al. | 455/234.1 |

OTHER PUBLICATIONS

3GPP TS 36.211 V8.6.0 (Mar. 2009); 3rd Generation Partnership Project; Technical Specification Group Radio Access Network; Evolved Universal Terrestrial Radio Access (E-UTRA); Physical Channels and Modulation (Release 8) (83 pages).

* cited by examiner

AUTOMATIC GAIN CONTROL SYSTEM

RELATED APPLICATION

This application claims the benefit of Great Britain Application No. 0805685.5 filed Mar. 28, 2008, which is incorporated herein by reference.

FIELD OF THE INVENTION

The present invention relates generally to communication, and more specifically to automatic gain control (AGC) for a wireless receiver, and in particular but not exclusively, for the LTE (EUTRAN) receiver.

BACKGROUND

Automatic gain control or AGC systems are known and widely used. The purpose of the AGC system is to adjust the level of a received signal in the receiver at an input of an analog-to-digital converter (ADC). The AGC system controls the receiver gain in order to keep the signal level at the ADC input as close as possible to a reference level, in order to avoid saturation of the ADC, whilst ensuring that the full range of the ADC is utilized to thereby provide the required signal to noise ratio (SNR) in the sampled signal. A further purpose of the AGC is to maintain the level of the receiver baseband (BB) output signal as close as possible to a reference level.

The general principle of AGC systems comprises measuring the received signal and using that measurement in computing and setting a required gain for the receiver. Generally, an average power may be measured over a certain duration of time and the measured average power then used in the AGC system. The duration of time over which the average power measurement is taken determines the rate at which the AGC system updates the receiver gain.

An example radio frame structure, such as may be used in a network connection in an EUTRAN communication system, is illustrated in FIG. 1. In the example radio structure, each radio frame is split into 10 sub-frames, with each sub-frame comprising two slots. The transmitted signal in each sub-frame may comprise a number of resource blocks ($N_{RB}$) and a number of OFDM symbols in each resource block (FIG. 2). Each transmitted resource block (RB) consist 12 sub-carriers and 14 OFDM symbols with a prefix. The first and fifth OFDM symbols of each slot comprise two permanent common pilot (PCP) sub-carriers, with the remaining sub-carriers available for use as data sub-carriers. These symbols comprising PCP sub-carriers are called pilot symbols. These act as reference symbols and are known symbols. The third, fourth, sixth and seventh OFDM symbols may contain data sub-carriers. These symbols are named as the data symbols. However, further pilot symbols may be present in the received signal due to signals transmitted from other transmitting antennas in the cell.

The minimum time required for correct measurement of the OFDM symbol power is determined by the sub-carrier spacing. In EUTRAN wireless telecommunication systems the sub-carrier spacing is 15 kHz and the minimum time required for correct measurement of the OFDM symbol power is 66.66 μs. However, a 66.66 μs duration time may be too short to be suitable for the updating time in a EUTRAN system.

For a EUTRAN system the average power measurement duration time, and correspondingly the gain updating time, may be chosen equal one sub-frame (for example 1 ms) as in a WCDMA receiver. Therefore, for a EUTRAN system the AGC system may measure the average power for the current sub-frame and use this measured value to calculate and set the required gain for the next sub-frame.

The transmitted average power of the signal measured over a sub-frame duration may vary from sub-frame to sub-frame. The average power variation may depend on the employed number of resource blocks ($N_{RB}$). The minimum number of resource blocks may be zero. The maximum value of $N_{RB}$ depends on the transmission bandwidth configuration in the cell and may vary, for example from 6 to 100. The transmission bandwidth configuration, i.e. the maximum value of $N_{RB}$ may be known. However, the number of resource blocks in use during any one sub-frame depends on wireless call scheduling and may not be accurately predicted in advance.

FIG. 3 shows one example of the transmitted EUTRAN signal which consists of two sub-frames. The first sub-frame comprises only the permanent common pilot signals, and no data transmissions. The average power of the signal in the first sub-frame is given by:

$$P_{av1} = \frac{2 \cdot P_{PCP} \cdot N_{RB} \cdot 4}{14} \qquad \text{i.}$$

where $P_{PCP}$ is the power received due to a single sub-carrier.

For the second sub-frame all available data sub-carriers are in use. The average power of the signal in the second sub-frame is given by:

$$P_{av2} = \frac{12 \cdot P_{PCP} \cdot N_{RB} \cdot 14}{14} \qquad \text{i.}$$

The ratio of the average powers of the first and second sub-frames is therefore:

$$10 \cdot \log\left[\frac{P_{av2}}{P_{av1}}\right] = 13.2 \text{ dB} \qquad \text{i.}$$

Thus, the range of the average power variations in this case is 13.2 dB. These average power variations can result in the receiver gain fast switching, which is undesirable. Therefore, problems exist in using known AGC systems for EUTRAN receivers when the average power measured in the time domain is used for the gain calculation and setting.

Furthermore, adjusting the gain of the EUTRAN receiver based on the average power of the received signal requires extra headroom to be allowed for the analog-to-digital converter, in addition to the peak-to-average-ratio (PAR) and fading headroom, since the power of the OFDM symbols may exceed the sub-frame average power. For example for the first sub-frame (FIG. 3) the average power is $P_{av1}$ and the power of the PCP symbols is equal $2 \times P_{PCP} \times N_{RB}$. The ratio of the PCP symbol power to the sub-frame average power $P_{av1}$ is 5.4 dB. Therefore, the ADC should be allowed an extra headroom of 5.4 dB in order to avoid the clipping of the signal. This extra required headroom may result in a decrease in the required reference signal level at the ADC input, and therefore in a reduced signal-to-noise ratio (SNR) at the receiver output.

The receiver may also receive the desired signal associated with a local cell along with a strong interfering signal at an adjacent channel from a neighbouring cell. The interfering signal may be a GSM, WCDMA or EUTRAN signal. The average power of this interfering signal, or EUTRAN blocker, at the adjacent channel may vary in a similar way as the average power of the desired EUTRAN signal. Therefore, taking into account the contribution of this blocker signal to the received signal power, the power variation at the receiver input may increase in the presence of a blocker signal.

A known AGC system is described in U.S. 2006/0222118, "Automatic Gain Control for wireless receiver". In the described AGC system, an average power is measured with the aid of a power detector in the time domain, and this average power is used to control the adjustment of the LNA gain and the digital variable gain amplifier (DVGA).

A further known AGC system is disclosed in U.S. 2006/0222116, "AGC with integrated wideband interferer detector". In this AGC system, the average received power is measured with the aid of the RSSI calculator and the symbol power measured with the aid of the integrated wideband interferer detector. Both of these power measurement blocks measure the power in time domain. The average received power is used to control the adjustment of the LNA gain and the post mixer amplifier (PMA) gain.

A further known AGC system is disclosed in U.S. 2005/0250462, "Gain control circuit". In the described AGC system, the average received power is measured with the aid of a power detector in the time domain, and is used to control adjustment of the LNA gain and the base-band amplifier (BBA) gain.

All of these known AGC systems use the average power measured in the time domain to control adjustment of the gain and do not predict the variations in power of the required channel in a EUTRAN system when the number of resource blocks in use, $N_{RB}$, in not known. This problem may result in the EUTRAN receiver gain fast switching if any of these AGC systems were to be used in EUTRAN receiver.

It is an aim of some embodiments of the present invention to address, or at least mitigate, some of these problems.

SUMMARY

According to an aspect of the present invention, there is provided a method of controlling gain in a receiver, the method comprising amplifying a received signal in an amplifier, filtering the received signal, and controlling a first gain for the amplifier in dependence on a characteristic of the received signal and a characteristic of the filtered received signal.

Embodiments of the present invention may be able to provide advantages such as maintaining a stable gain setting in the receiver independent of the data allocation, or maintaining an optimum gain setting in the receiver even when a Blocker signal is present.

According to embodiments of the present invention, the method characteristic of the received signal may comprise a power of the received signal. The characteristic of the filtered received signal may comprise a power of the filtered received signal. The method may further comprise amplifying the filtered signal in a further amplifier, and controlling a second gain for said further amplifier in dependence on a characteristic of the received signal and a characteristic of the filtered received signal. Controlling said first gain may further comprise controlling said first gain in dependence on a maximum symbol power in a sub-frame of said received signal.

Controlling said second gain may further comprise controlling said second gain in dependence on a maximum symbol power in a sub-frame of said received signal and on a maximum symbol power in a sub-frame of said filtered received signal. The method may further comprise measuring a characteristic of one or more reference portions of the received signal. Said reference portions of the received signal may comprise pilot symbols. Said pilot symbols may comprise permanent common pilots. The characteristic of one or more reference portions may comprise a power of said one or more reference portions. Measuring a characteristic may further comprise performing a Fast Fourier Transform on said reference portions of the received signal. Measuring a characteristic may further comprise determining an average power of the permanent common pilot of pilot symbols in said received signal.

Controlling the first gain may further comprise determining a difference between said characteristic of the received signal and said characteristic of the filtered received signal. Determining a difference may further comprise determining a maximum value of said difference between said characteristic of the received signal and said characteristic of the filtered received signal. Said maximum value of said difference may be a value representative of a power of a blocking signal. Said controlling a first gain may further comprise determining a maximum expected value of said received signal, based on said value representative of the power of said blocking signal, and said average power of the permanent common pilot of pilot symbols in said received signal. Controlling a second gain may further comprise controlling said second gain in dependence on a maximum expected value of said filtered received signal and an average power of the permanent common pilot of pilot symbols in said received signal.

According to a further aspect of the present invention, there is provided an apparatus comprising an amplifier configured to amplify a received signal, a filter coupled to an output of said amplifier and configured to filter the amplified signal, and a controller configured to control a first gain for said amplifier in dependence on a characteristic of the amplified signal and a characteristic of said filtered received signal.

According to further embodiments of the present invention, the apparatus may further comprise a first power measurer coupled to said controller, and configured to measure a power of said amplified signal, wherein said characteristic of the amplified signal comprises a power of the amplified signal. The apparatus may further comprise a second power measurer coupled to said controller and configured to measure a power of said filtered signal, wherein said characteristic of the filtered signal comprises a power of the filtered signal. The apparatus may further comprise a further amplifier coupled to an output of said filter, and configured to amplify said filtered signal, wherein said controller is further configured to control a second gain for said further amplifier in dependence on said characteristic of the amplified signal and said characteristic of said filtered signal.

The controller may be further configured to control said first gain in dependence on a maximum signal power in a sub-frame of said received signal. Said controller may be further configured to control said second gain in dependence on a maximum symbol power in a sub-frame of said received signal and on a maximum symbol power in a sub-frame of said filtered received signal.

The first power measurer may be configured to measure the power of one or more reference portions of the amplified signal. Said reference portions of the received signal may comprise pilot signals. Said pilot signals may comprise permanent common pilots. The apparatus may further comprise a power estimator configured to receive the output of said further amplifier and estimate an average power of permanent common pilot of pilot symbols of said received signal. The power estimator may be further configured to estimate said average power of permanent common pilot of pilot symbols by performing a Fast Fourier Transform on said reference portions of the received signal.

The controller may be further configured to control said first gain in dependence on a difference between said characteristic of the amplified signal and said characteristic of the filtered signal. Said controller may be further configured to determine a maximum value of said difference between said characteristic of the amplified signal and said characteristic of said filtered signal. Said maximum value of said difference may be a value representative of a power of a blocking signal.

The controller may be further configured to determine a maximum expected value of said received signal based on said value representative of power of said blocking signal, and on said average power of permanent common pilot of the pilot symbols in said received signal. Said controller may be further configured to control said second gain in dependence on a maximum expected value of said filtered received signal and said average power of permanent common pilot of said pilot symbols in said received signal.

The apparatus may further comprise an analog-to-digital converter configured to sample said amplified signal, and to provide said samples of the amplified signal to said filter, wherein said characteristic of the amplified signal comprises a characteristic of the sampled amplified signal.

According to a further aspect of the present invention, there is provided a computer program code means adapted to perform any of the steps of the described method when the program is run on a processor.

According to a further aspect of the present invention, there is provided an electronic device comprising the described apparatus.

According to a further aspect of the present invention, there is provided a chipset comprising the described apparatus.

According to a further aspect of the present invention, there is provided an apparatus comprising amplifying means for amplifying a received signal, filtering means for filtering the amplified received signal, controlling means for controlling a gain for said amplifying means in dependence on a characteristic of the amplified signal and a characteristic of the filtered signal.

BRIEF DESCRIPTION OF THE DRAWINGS

Embodiments of the present invention will now described by way of example only with reference to the accompanying Figures, in which:—

DESCRIPTION OF EXEMPLIFYING EMBODIMENTS

Embodiments of the present invention are described herein by way of particular examples and specifically with reference to preferred embodiments. It will be understood by one skilled in the art that the invention is not limited to the details of the specific embodiments given herein.

Figure 4:
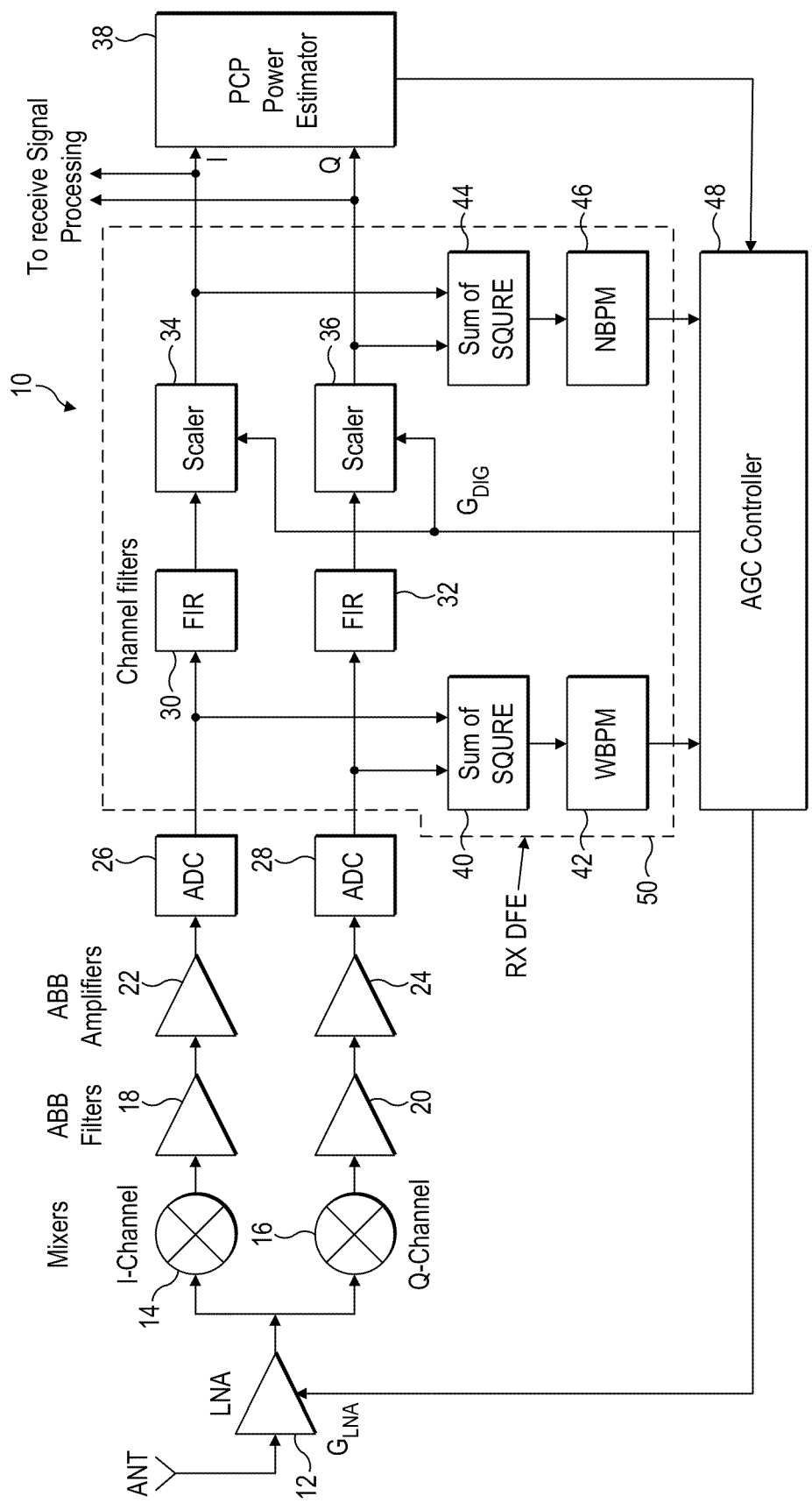
FIG. 4 presents an example block diagram of an AGC system suitable for implementing an embodiment of the present invention.

FIG. 4 shows a portion of a receiver 10 comprising one of various embodiments of an automatic gain control system, and suitable for implementing some embodiments of the present invention. In particular, this AGC system may be suitable for use in a EUTRAN receiver.

Some embodiments of the present invention may provide an AGC system for controlling a receiver gain based on measurement of the power of permanent common pilot (PCP) of pilot symbols in the received signal. According to one embodiment of the invention, measurement of the PCP power of pilot symbol may be performed in the frequency domain.

In some embodiments of the present invention, the AGC system may be able to adjust the receiver gain in an initial synchronization mode as well as in a tracing mode once synchronization has been achieved. The receiver of FIG. 4 comprises an antenna connected to an input of a low noise amplifier (LNA) 12 to amplify the received signal. The gain of the LNA 12 is controllable via a $G_{LNA}$ value received by the LNA 12 on a second input. The amplified received signal is provided at an output of the LNA 12, which is coupled to a mixer stage for down conversion of the radio frequency amplified received signal to an intermediate frequency (IF), or baseband frequency. The mixer stage comprises a complex mixer 14, 16, that is driven by a local oscillator (not shown) and provides quadrature signal components, i.e. an in phase (I) signal component is provided by I-channel mixer 14, and a quadrature (Q) signal component is provided by Q-channel mixer 16.

The I and Q signal components output from the mixer stage may be filtered using analog baseband filters (ABBF) 18, I-channel, and 20, Q-channel. A corner frequency for the filters 18 and 20 is set to accommodate the bandwidth of any signal of interest. The outputs of the I and Q channels from the ABBF are coupled to respective analog baseband amplifiers (ABBA) 22, I-channel, and 24, Q-channel. The ABBA 22 and 24 may provide signal amplification and DC-offset compensation. The DC-offset compensation may be provided due to the frequency dependent feedback of the ABBA.

The outputs of the ABBA 22 and 24 are coupled analog-digital-converters (ADC) 26, I-channel, and 28, Q-channel. The outputs of the ADC are coupled to a receiver digital front end (RX DFE) 50 that may comprise digital channel filters (FIR) 30 and 32, scalers 34 and 36, a wideband power measurement (WBPM) block 42, a narrowband power measurement block (NBPM) 46 and two a Sum-of-Squares blocks 40 and 44. The channel filters 30 and 32 receive the digitised received signals from the ADCs 26 and 28 and provide attenuation for any signals present in an adjacent channel. The output of the channel filters is then applied to the scalers 34 and 36. The scalers are controllable via a received gain value $G_{DIG}$ and provide the amplification of the digital samples in the I and Q paths to maintain the baseband output of the receiver at a reference level.

The output signal from the scalers 34 and 36 are coupled to a PCP Power Estimator 38 as well as additional receive signal processing (not shown). The PCP Power Estimator 38 processes the I and Q samples of the input signal output by the scalers and calculates a power of the PCP sub-carriers present in the signal in the frequency domain.

The outputs from ADCs 26 and 28 are further coupled to the first Sum-of-Square block 40 that calculates a power ($I^2+Q^2$) that is supplied to the WBPM block 42. The output of the scalers 34 and 36 are further coupled to the second Sum-of-Square block 44 that computes a power ($I^2+Q^2$) that is used in the NBPM block 46. The operation of the WBPM 42 and NBPM 46 blocks is described below. The outputs of the PCP Power Estimator 38, the WBPM 42 and NBPM 46 blocks are coupled to the AGC controller 48. Using the power measurements supplied by the PCP Power Estimator 38, the WBPM 42 and NBPM 46 blocks the AGC controller 48 calculates the required $G_{LNA}$ and $G_{DIG}$ gains for the LNA 12 and the scalers 34 and 36. The outputs of AGC controller 48 are coupled to control inputs of the LNA 12 and the scalers 34 and 36 to supply the calculated gains.

Figure 5:
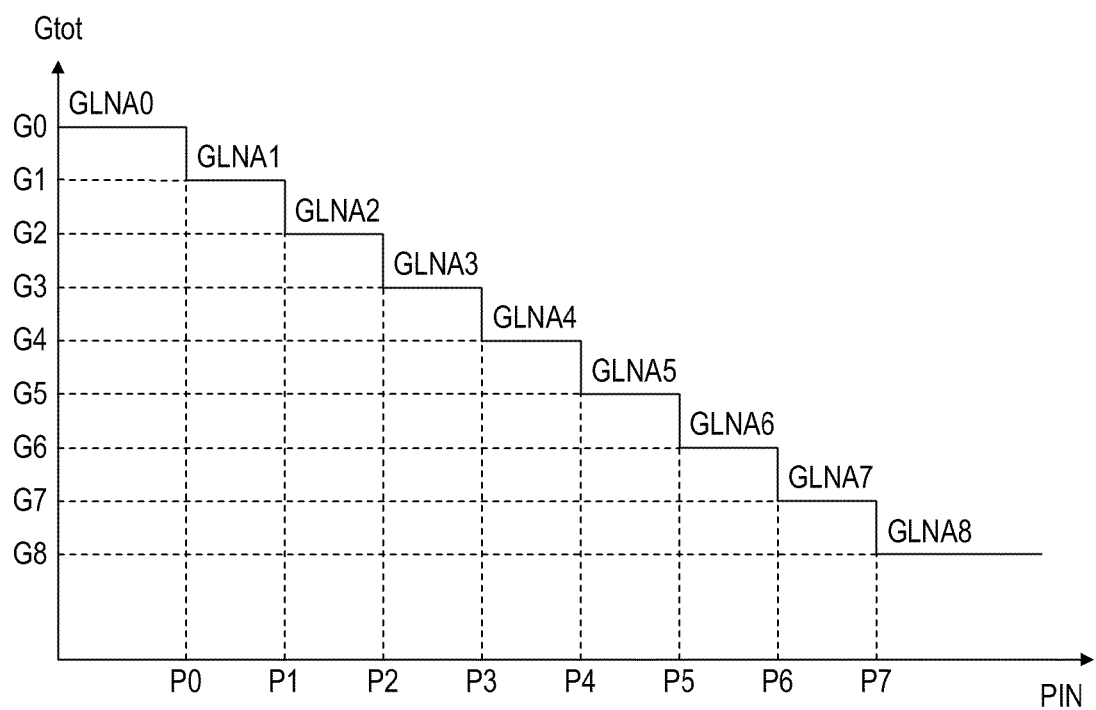
FIG. 5 presents a graph of a total analog gain $G_{tot}$ of the receiver with LNA gain setting versus input power $P_{in}$.

FIG. 5 shows the total analog gain $G_{tot}$ of the receiver with LNA 12 gain setting versus input power of the signal received at the antenna, in accordance with one embodiment of the present invention. In an exemplary embodiment of the present invention, the LNA 12 has nine gain setting ($G_{LNA0} \ldots G_{LNA8}$). The maximum total analog gain $G_{tot\_max}$=G0 may be chosen based on the gain required to provide a desired signal level at the input to ADCs 26 and 28 when the input power of the received signal is at a minimum level for which the receiver 10 is expected to receive the signal.

In one embodiment of the present invention, each scaler 34 and 36 may comprise a digital variable gain amplifier (DVGA). The DVGA may be implemented as a register coupled in series with a left shift and a multiplier. In this example the gain of the scalers may be:

$$G_{DIG} = G_{Scaler} = 2^{Shift} \cdot \frac{M}{K},$$

where K is a constant, Shift represents the configured number of bits by which the input value is shifted to the left in the register, and M is the configured multiplier factor.

Figure 6:
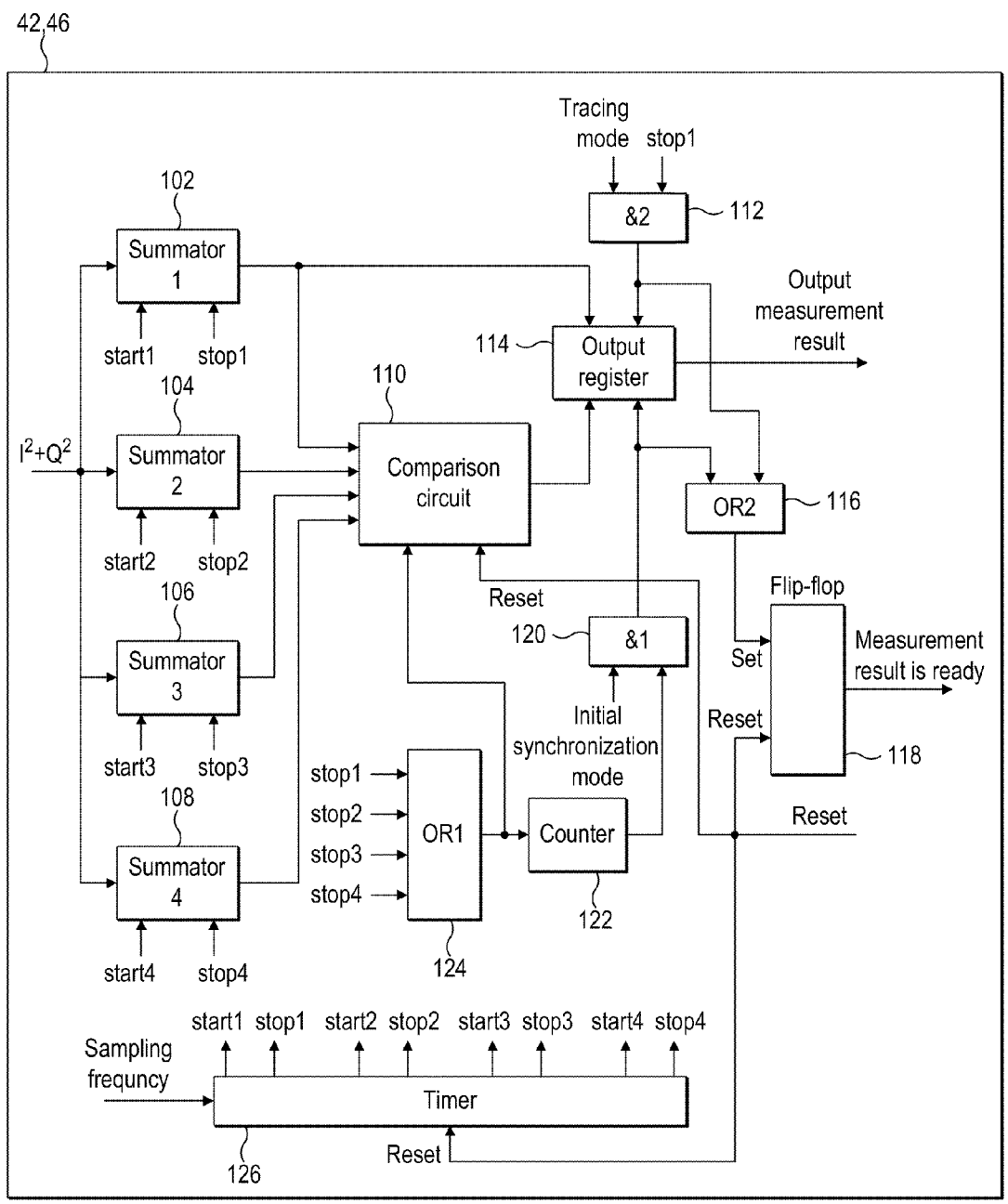
FIG. 6 presents an example block diagram of the WBPM and NBPM blocks according to an embodiment of the present invention.

In some embodiments of the present invention, WBPM 42 and NBPM 46 may share the same structure. A example structure for WBPM 42 and NBPM 46 is shown in FIG. 6. The WBPM 42 and NBPM 46 may be configured to provide power measurements in the initial synchronization mode, and in the tracing mode. In the illustrated structure, the power measuring blocks comprise: a timer 126, four summators 102, 104, 106 and 108, a comparison circuit 110, a counter 122, a flip-flop 118, two OR gates 116 and 124, and 2 AND gates 112 and 120. This example structure is configured for four sliding windows per OFDM symbol time duration.

In the circuit shown in FIG. 6, the sample power ($I^2+Q^2$) calculated in the respective sum of square block is applied to the input of each of the four Summators 102, 104, 106, and 108. Each Summator also receives respective Start and Stop signals supplied by the Timer 126 in order to individually control the period for which each Summator sums the received power values. The Timer 126 receives a sampling frequency signal. The output of each Summator is coupled to comparison circuit 110, and the output of the comparison circuit 110 is coupled to output register 114. The output of Summator1 102 is further coupled to output register 114. The output of the output register 114 provides an Output Measurement result.

A first OR-gate, OR1, 124 receives as inputs the Stop signals (STOP1: STOP4). An output of the first OR-gate 124 is coupled to the counter 122 and also to the comparison circuit 110. The output of counter 122 is coupled to a first AND-gate 120, which also receives an initial synchronisation mode signal. The output of first AND-gate 120 is coupled to the output register 114, and also to a second OR-gate 116.

A second AND-gate 112 receives as inputs a tracing mode signal and the Stop signal provided to Summator1 102, Stop1. An output of the second AND-gate 112 is coupled to the output register 114 and also to second OR-gate 116. A Reset signal is provided and is coupled to inputs of the Timer 126, the comparison circuit 110 and also to a reset input of a Flip-Flop 118. A set input of the Flip-Flop 118 is coupled to the output of second OR-gate 116. The output of Flip-Flop 118 provides a signal indicating that the Output Measurement result is ready.

During initial synchronization, the location of the OFDM symbols may not be known, and so a sliding window mode may be used to obtain the correct power measurement. In this mode, the WBPN 42 and NBPN 46 may measure symbol power to determine the maximum received power level over the duration of one slot. The initial synchronization mode according to one embodiment of the present invention is illustrated in FIG. 7.

Figure 7:
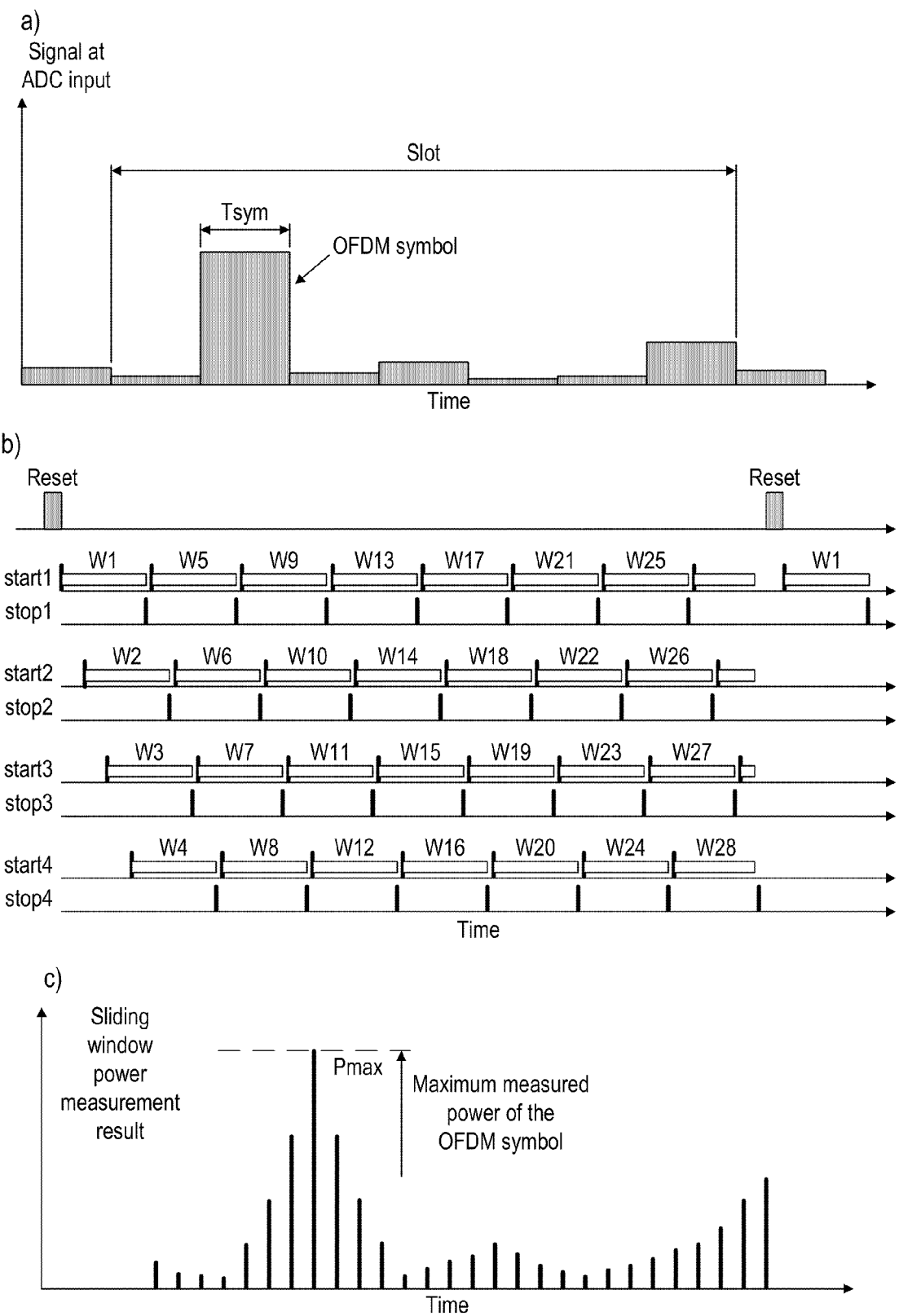
FIG. 7 illustrates a sliding window power measurement method.

FIG. 7 a) shows the power levels at the ADC input for a received signal. Each OFDM symbol has a certain associated power level for the duration of the symbol. FIG. 7 b) shows the Reset signal and the Start and Stop signals for each of the Summators generated by the Timer 126. The FIG. 7 c) shows the measurement result measured at sliding window time durations W1 ... W28.

The Reset signal resets the Timer 126 and the Comparison circuit 110 to an initial condition. The Comparison circuit 110 is reset in response to the Reset signal to store a power level equal to "zero" which is used for next comparison. Using the sampling frequency the Timer forms the Start and Stop signals which determine the power measurement windows W1, W2 . . . , etc. as shown in FIG. 7. Each Summator is reset to level "zero" at the beginning of the window in response to receiving the Start signal.

The signals Start1 and Stop1 form the window W1. For the duration of window W1 the Summator1 102 sums up the received power samples ($I_i^2+Q_i^2$) from the Sum-of-Square block. After signal Stop1 the Summator1 102 sum of the received power samples is divided by the number of samples $N_{samp}$ to calculate the average received power:

$$P_{Summator1} = \frac{\sum_{i}^{N_{samp}} (I_i^2 + Q_i^2)}{N_{samp}}$$

$P_{Summator1}$ is then compared in the Comparison circuit 110 with the previous stored result. Since the first window W1 directly follows a Reset, the previous stored result in the Comparison circuit 110 will have been reset by the Reset signal, and the result $P_{Summator1}$ will be more than "zero". The value $P_{Summator1}$ will therefore be stored in the Comparison circuit to be used for the next comparison.

Measurement window W2 is defined by the signals Start2 and Stop2, and may have a time shift relative to W1 of, for example, $T_{symb}/4$. After the signal Stop2 is received, the Summator2 104 provides the result $P_{Summator2}$ to the Comparison circuit 110. $P_{Summator2}$ is compared in the Comparison circuit with the last stored result $P_{Summator1}$ to determine which value is larger. The value found to be larger by the comparison is then stored in the Comparison circuit 110 to be used for the next comparison.

This procedure then continues for window W3 measured by Summator3 106, and W4 measured by Summator4 108, before returning to Summator1 102 to measure the average power for window W5. The sliding window measurements continue to measure received power values for the slot duration, which for the illustrated example comprises seven symbols with the sliding windows at a time shift of $T_{symb}/4$, leading to a total of 28 sliding window results, W1 to W28 over the slot duration, as shown in FIG. 7.

Therefore, for the embodiment illustrated in FIG. 7, the capacity of the counter 122 may be chosen to be equal to twenty eight, to count the twenty eight Stop signals in the duration of one slot. Once twenty eight Stop signals have been counted, the counter 122 will provide a repletion signal to the first AND-gate 120. During the initial synchronization mode, the initial synchronization mode signal will be set, and therefore the repletion signal will be provided to the Output register 114. In response to the repletion signal, the Output register 114 will store the comparison value being output by the Comparison circuit 110.

Once all twenty eight windows have been processed by the Comparison circuit 110, the comparison value stored in the Comparison circuit, and output to the Output register, will be the highest average power measured over any one processing window W1 to W28. Thus the highest measured average power, will be stored in the Output register in response to the repletion signal.

The repletion signal is further coupled, through the second OR-gate 116, to the set input of the Flip-Flop 118, such that the Measurement result ready signal is set in response to the repletion signal, thereby indicating that the measurement result of the symbol power with the greatest power level is ready.

In the tracing mode of operation, the location of OFDM symbols is known. The Reset signal is applied to start the Timer 126 in synchronization with the OFDM symbol. As the Timer 126 is operated in synchronization with the OFDM symbols, measurement of the symbol powers may be made using a single Summator, for example Summator1 102.

The Summator1 102 sums up the received power samples for the duration of window W1, based on the signals Start1 and Stop1 received from the Timer 126. The signal Stop1 is also applied to the second AND-gate 112. During tracing mode, the tracing mode signal applied to the second AND-gate will be set, and therefore the Stop1 signal will control the output of the second AND-gate. Therefore, the Stop1 signal will be received by the Output register.

In response to the Stop1 signal, the Output register 114 will store the result $P_{Summator1}$ supplied to the Output register from Summator1 102. Further in response to the Stop1 signal, the Flip-Flop 118 will be caused to be set, indicating that the measurement result of the current symbol power is ready.

According to some embodiments of the present invention, the PCP power Estimator 38 is used for the measurement of the PCP sub-carrier power in frequency domain. The PCP power Estimator 38 may be implemented on a processor.

Figure 12:
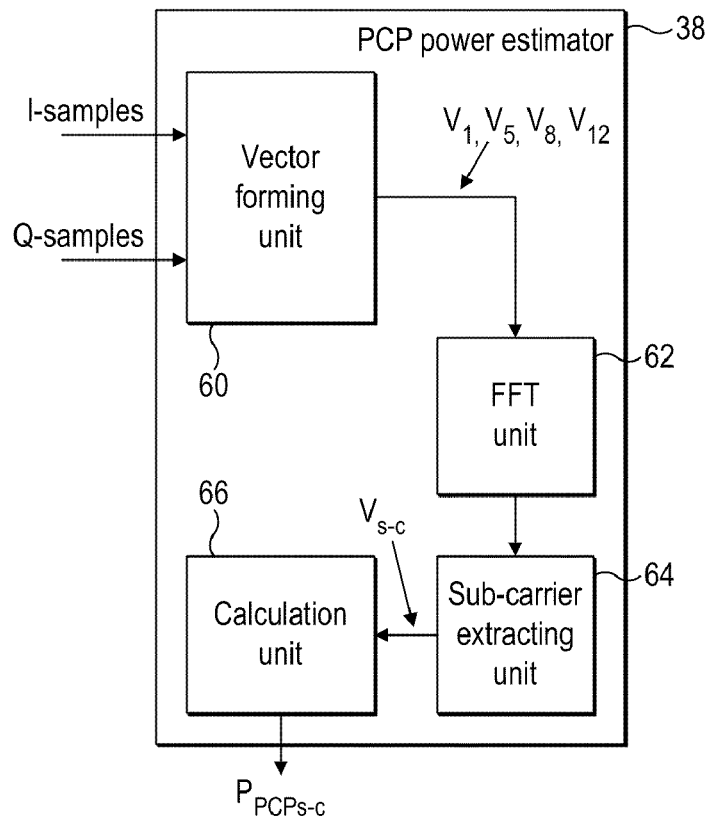
FIG. 12 shows an example structure of the PCP Power Estimator unit of FIG. 4.

FIG. 12 illustrates the PCP Power Estimator 38 according to one embodiment of the present invention. The PCP Power Estimator may comprise a Vector Forming Unit 60, a FFT Unit 62, a Sub-carrier Extracting Unit 64, and a Calculation Unit 66.

Figure 8:
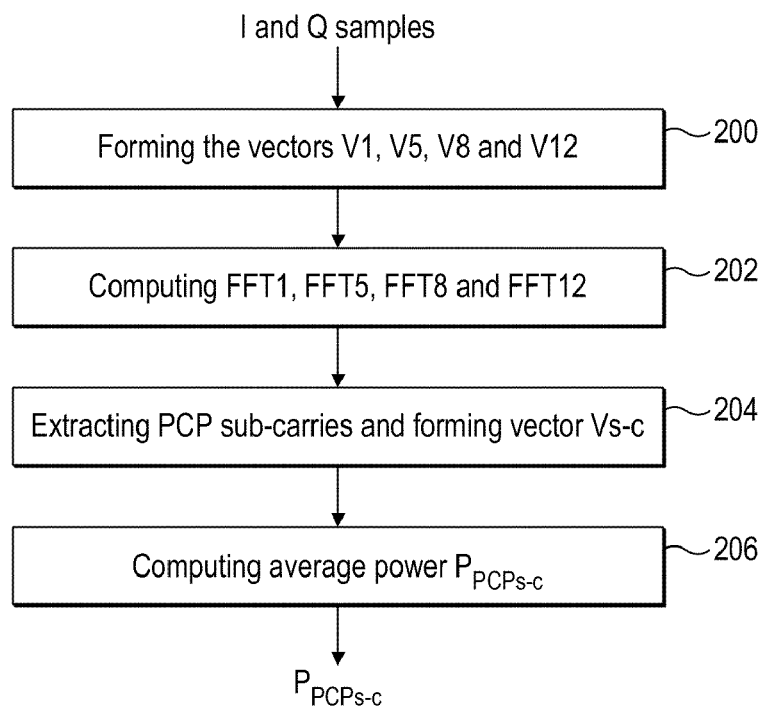
FIG. 8 illustrates a method of measuring the PCP sub-carrier power.

FIG. 8 shows a method of measuring the PCP power I and Q samples, according to one exemplary embodiment of the present invention.

Figure 1:
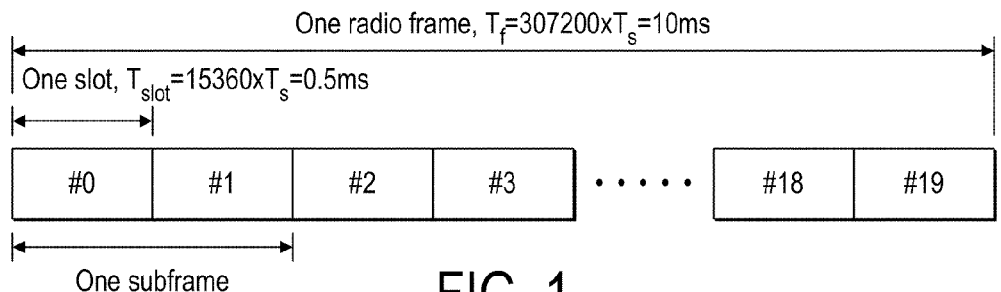
FIG. 1 presents an example radio frame structure of a downlink EUTRAN system.
Figure 2:
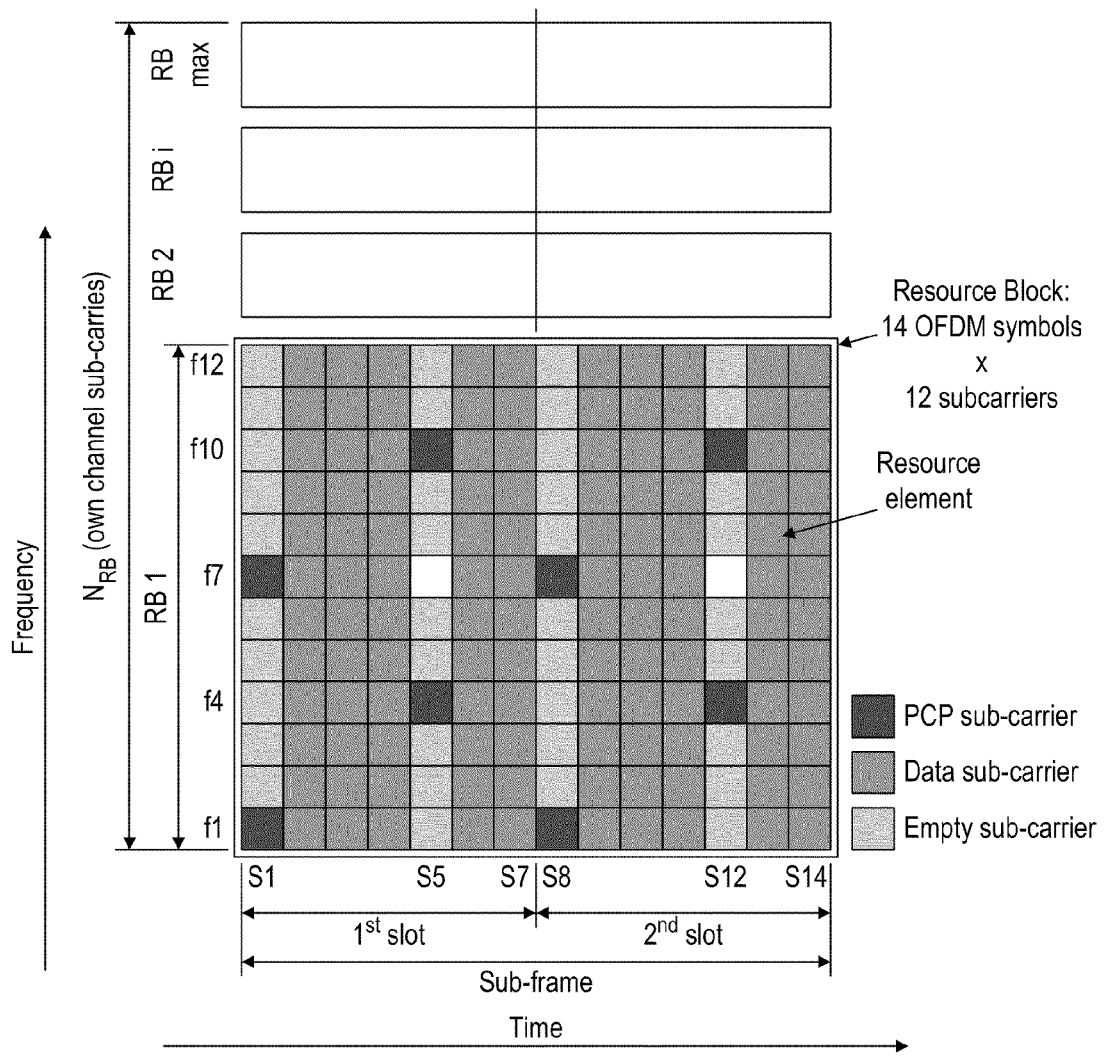
FIG. 2 presents an example EUTRAN downlink sub-frame structure.
Figure 3:
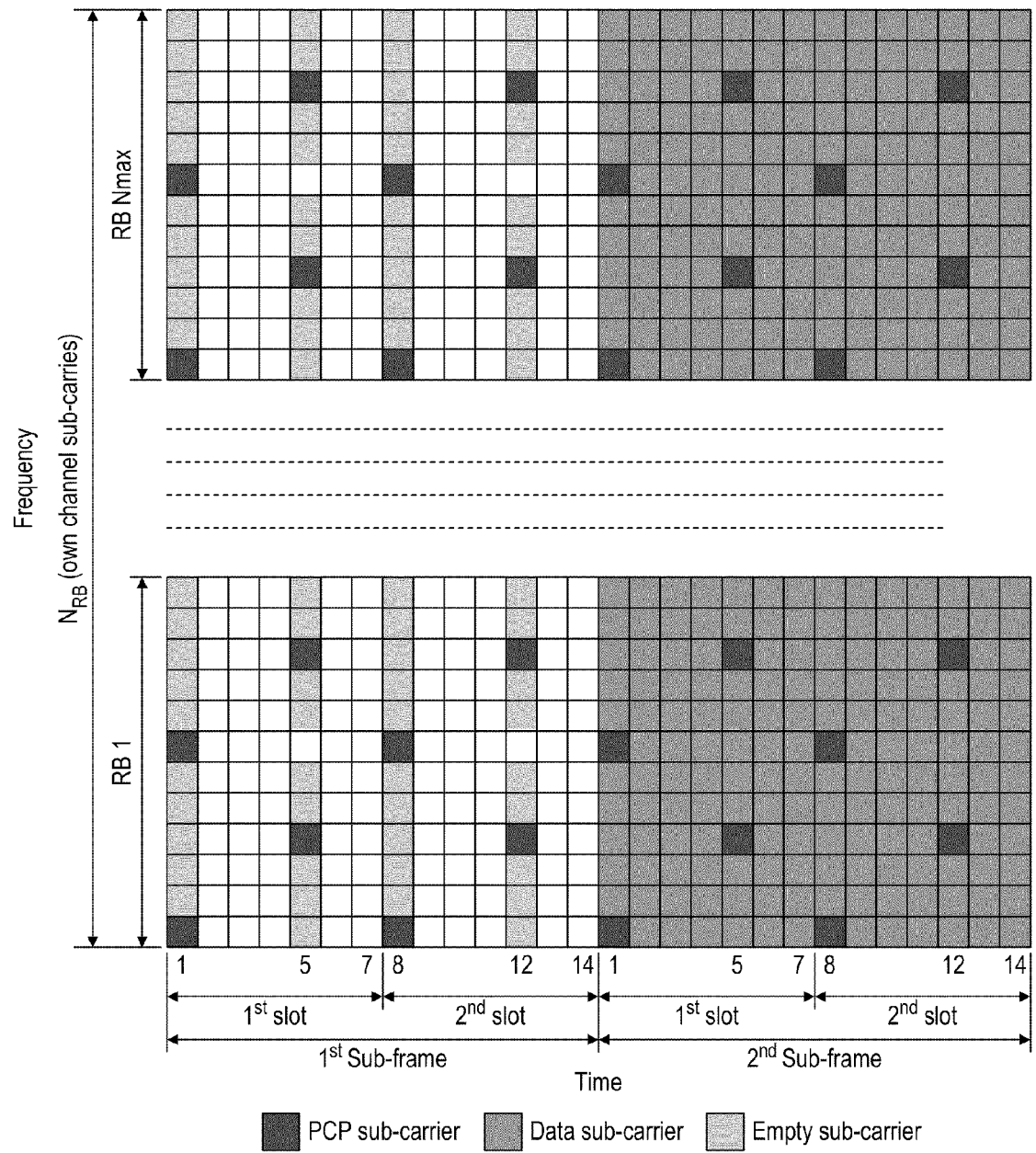
FIG. 3 presents an example of the EUTRAN downlink sub-frames with a different number of resource blocks.

According to the embodiment of FIG. 8, the PCP Power Estimator 38 may operate in the tracing mode only. The Vector Forming unit 60 of the PCP Power Estimator may form the complex vectors V1, V5, V8, V12 for each of the 1st, 5th, 8th and 12th OFDM symbols contained the PCP (FIG. 2) from the I and Q samples delivered from RX DFE over the duration of a sub-frame in step 200. In step 202, a fast Fourier transform (FFT) may then be generated in FFT unit 62 for each of the complex vectors to provide vectors FFT1, FFT5, FFT8 and FFT12 for the $1^{st}$, $5^{th}$, $8^{th}$ and $12^{th}$ OFDM symbols respectively. The PCP sub-carriers may then be extracted, in Sub-carrier Extracting unit 64, from the FFT vectors and a vector $V_{s-c}$ is then formed containing all the PCP sub-carriers in the current sub-frame of the received signal, as in step 204. The PCP average power, $P_{PCPs-c}$, may then be calculated in the Calculation unit 66 from the vector $V_{s-c}$, as shown in step 206.

According to one embodiment of the present invention, the AGC controller 48 is used for the calculation and the setting of the required gains of the LNA 12 and Scalers 34 and 36 in the initial synchronization mode and in the tracing mode. The AGC controller may be implemented on a processor.

Figure 13:
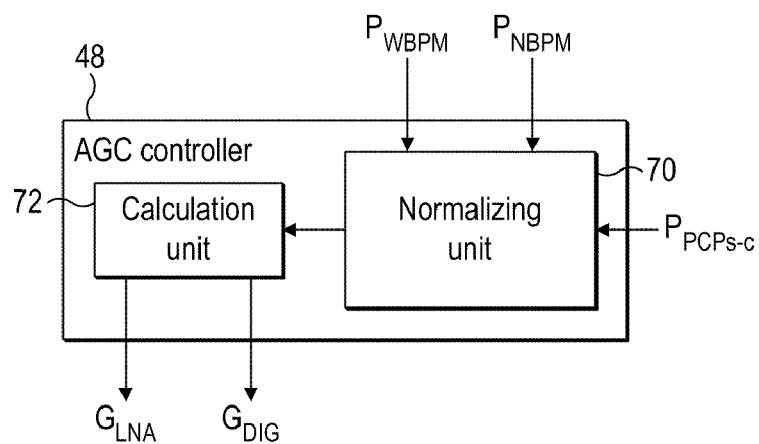
FIG. 13 shows an example structure of the AGC Controller of FIG. 4.

An example structure of the AGC Controller 48 is shown in FIG. 13. The AGC controller may comprise a Normalizing unit 70 for normalizing the received gain values for use in the gain setting calculations, and a Calculation unit 72 which receives the normalized gain values and uses them to calculate the required gains for the LNA 12 and the Scalers 34 and 36.

Figure 9:
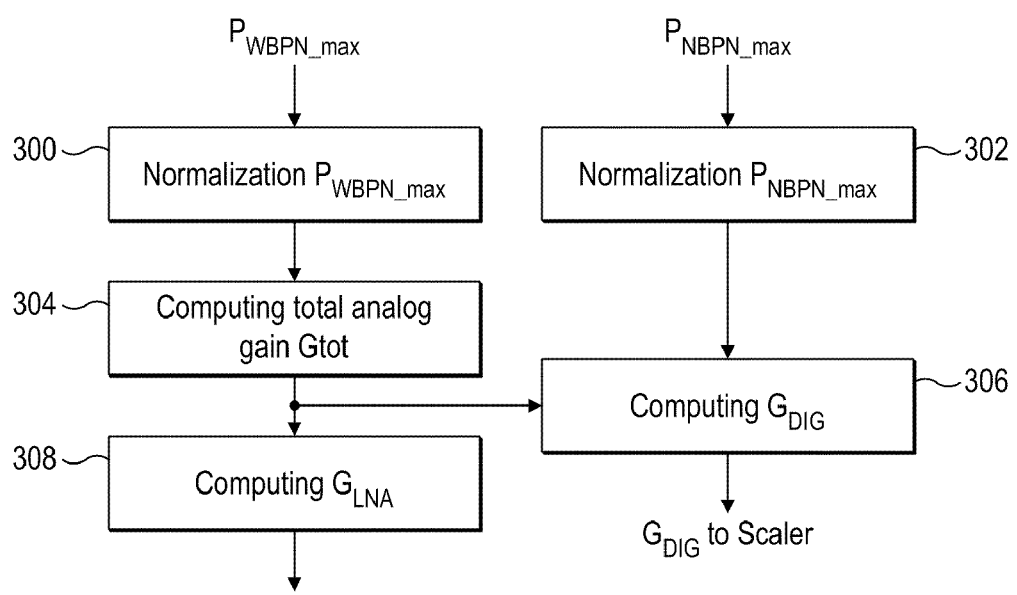
FIG. 9 illustrates a method of calculating the LNA gain $G_{LNA}$ and the Scaler gain $G_{DIG}$ in an initial synchronization mode, in accordance with an embodiment of the present invention.

FIG. 9 shows a method of calculating the required gains for the LNA 12 and the Scalers 34 and 36 in the initial synchronization mode using the $P_{WBPM\_max}$ and $P_{NBPM\_max}$ measured by the WBPM and NBPW blocks according to one embodiment of the present invention. This method comprises the following steps:

In step 300, the measured power $P_{WBPM\_max}$ is normalized using a total gain for the signal between the antenna and the WBPM block, i.e. the power is normalized relative to the signal power received at the antenna.

In step 302, the measured power $P_{NBPM\_max}$ is normalized, similarly to the normalization of $P_{WBPM\_max}$ in step 300, using total gain for the signal between the antenna and the NBPM block.

Figure 10:
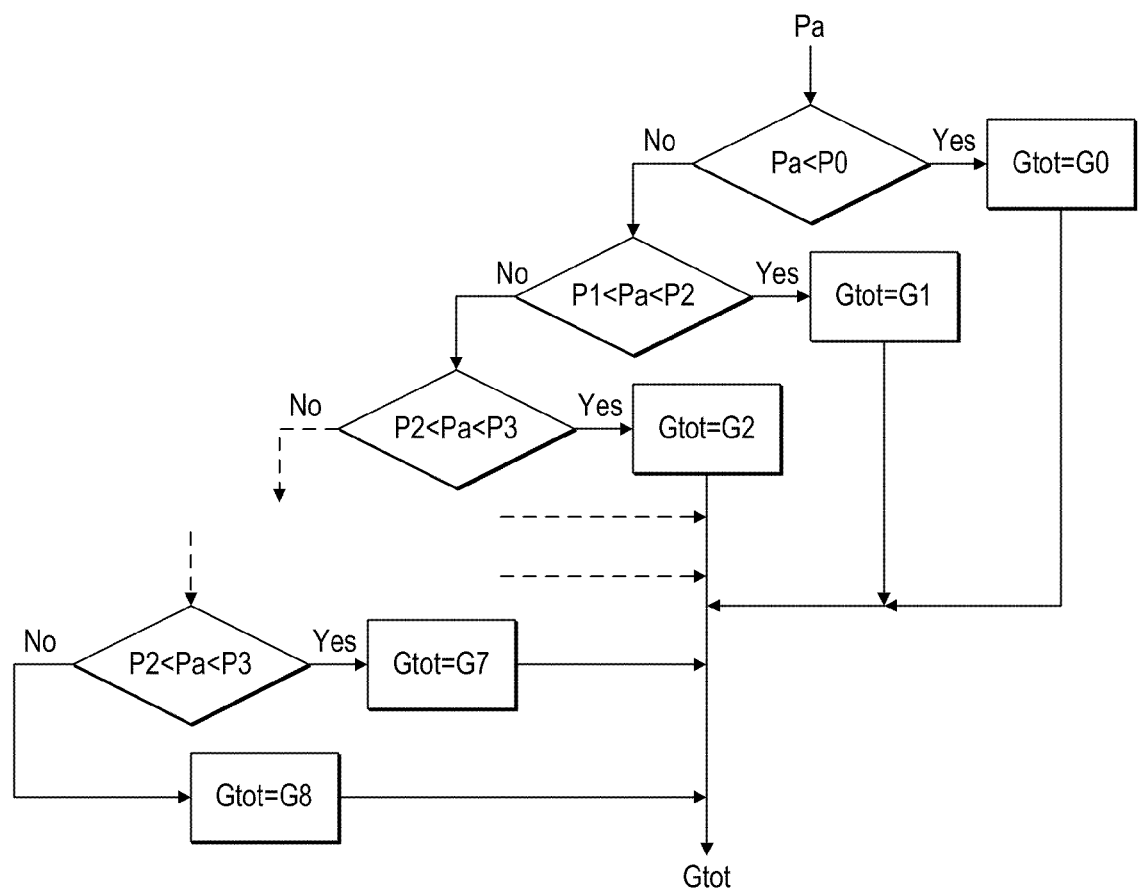
FIG. 10 illustrates an algorithm for determining the total analog gain $G_{tot}$, in accordance with an embodiment of the present invention.

In step 304, the total analog gain $G_{tot}$ is calculated based on the analog control power, $P_a$, equal to $P_{WBPM\_max}$ and an algorithm as illustrated in FIG. 10. In FIG. 10, the gains G0 ... G8 correspond to the input powers P0 ... P8 as shown in FIG. 5.

In step 308, the LNA gain, $G_{LNA}$, is calculated based on $G_{tot}$. According to one embodiment of the present invention, $G_{LNA}$ is generated in accordance with Table 1, which is based at the total analog gain curve versus $P_{in}$ (FIG. 5).

TABLE 1

| | | | | LNA gain settings | | | | |
|---|---|---|---|---|---|---|---|---|
| G0 | G1 | G2 | G3 | G4 | G5 | G6 | G7 | G8 |
| GLNA0 | GLNA1 | GLNA2 | GLNA3 | GLNA4 | GLNA5 | GLNA6 | GLNA7 | GLNA8 |

The Scaler gain $G_{DIG}$ is computed at step 306, based on $P_{NBPM\_max}$, $G_{tot}$ and the required reference level $P_{BB\_ref}$ at the receiver BB output according to the equation:

$$G_{DIG} = \frac{P_{BB\_ref}}{P_{NBPM\_max} \cdot G_{tot}}$$

After the calculation of $G_{LNA}$ and $G_{DIG}$, the AGC controller 48 sets the updated gains which may then be applied to the LNA 12 and the Scalers 34 and 36.

Figure 11:
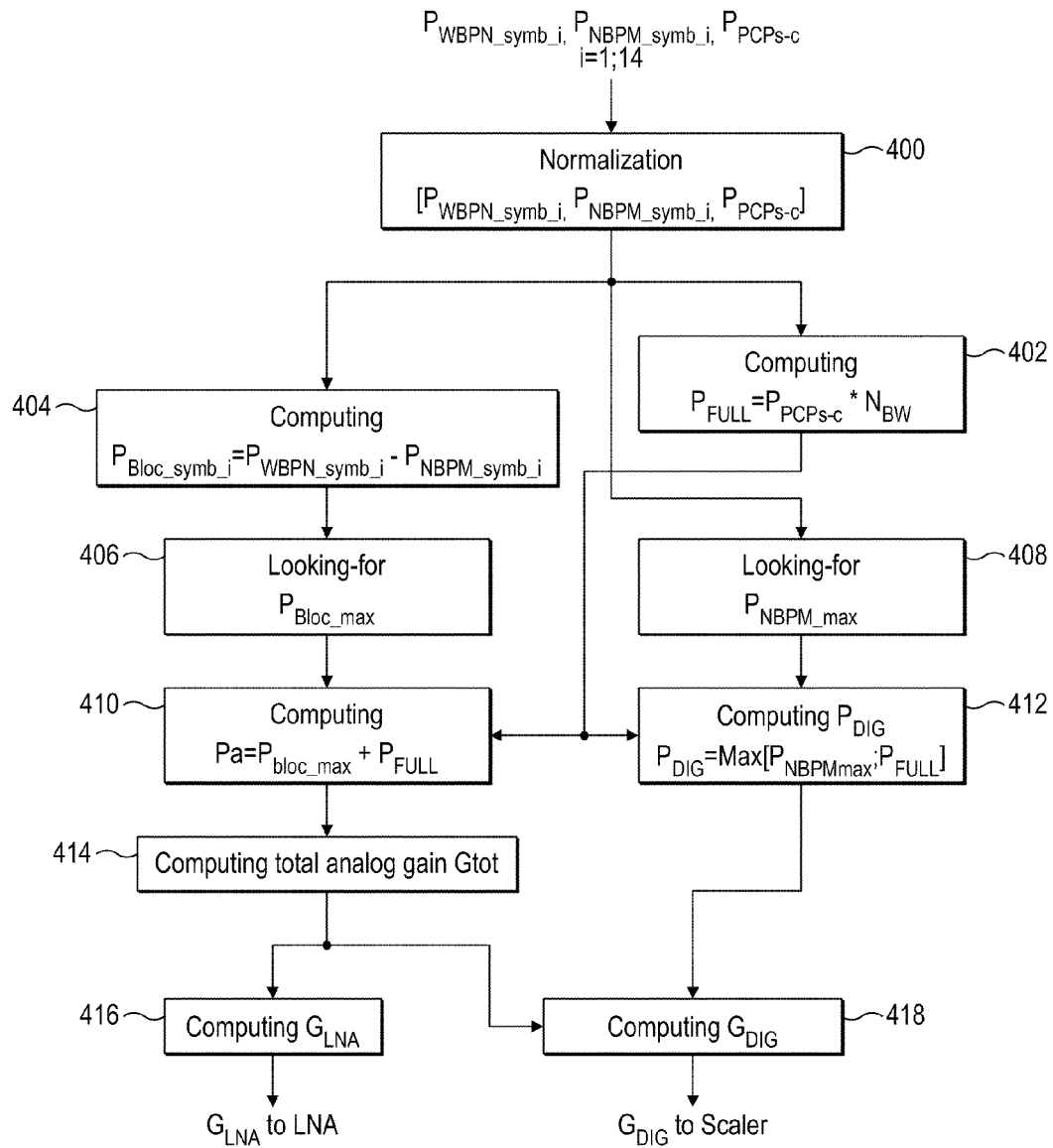
FIG. 11 presents a method of calculating the LNA gain $G_{LNA}$ and the Scaler gain $G_{DIG}$ in a tracing mode, in accordance with an embodiment of the present invention.

FIG. 11 shows a method of calculating the required gains for the LNA and Scalers in tracing mode, according to one embodiment of the present invention.

In the method of FIG. 11, the AGC controller 48 calculates the required gains for the LNA 12 and Scaler based on measurement of the symbol powers by the WBPM 42 and NBPM 46 blocks and of the PCP sub-carrier power by the PCP Power Estimator 38 over the duration of a sub-frame. The method comprises the steps of:

In step 400, the measured symbol powers $P_{WBPM\_symb\_i}$ and $P_{NBPM\_symb\_i}$, and the PCP sub-carrier power $P_{PCPs-c}$ are normalized based on the total gain between the antenna and the WBPM block 42, the NBPM block 46, and the PCP Power Estimator 38, respectively.

The power of interfering Blocker signals for each symbol is calculated in step 404, based on the normalized symbol powers $P_{WBPM\_symb\_i}$ and $P_{NBPM\_symb\_i}$. The Blocker power may be calculated:

$$P_{Bloc\_symb\_i} = P_{WBPM\_symb\_i} - P_{NBPM\_symb\_i}$$

The maximum value of the Blocker power, $P_{Bloc\_max}$ is determined from the Blocker power $P_{Bloc\_symb\_i}$ of each of the symbols, in step 406.

The power of the required channel for a full allocation of resource blocks, RB $P_{FULL}$ is calculated in step 402 according to the equation:

$$P_{FULL} = P_{PCPs-c} \times N_{BW}$$

The analog control power Pa is calculated in step 410, based on $P_{FULL}$ and $P_{Bloc\_max}$. The analog control power may be determined by adding $P_{FULL}$ and $P_{Bloc\_max}$.

The maximum value of the NBPM power measurement result $P_{NBPM\_max}$ is determined from the normalized power values, $P_{NBPM\_symb\_i}$, for each of the symbols, at step 408.

The digital control power $P_{DIG}$ may then be calculated by taking the greater value of $P_{NBPM\_max}$ and $P_{FULL}$, as shown in step 412.

In step 414, the total analog gain $G_{tot}$ is computed using the analog control power Pa and the algorithm as shown in FIG. 10. In FIG. 10, the gains G0 . . . G8 correspond to the input powers P0 . . . P8, as shown in FIG. 5.

The LNA gain may then be calculated in step 416 based on $G_{tot}$, and in accordance with Table 1. The values of Table 1 is based on the total analog gain curve versus $P_{in}$, as shown in FIG. 5.

The Scaler gain $G_{DIG}$ is calculated based on $P_{DIG}$, $G_{tot}$ and the required reference level $P_{BB\_ref}$ at the receiver BB output, in step 418. This may be achieved using the equation:

$$G_{DIG} = \frac{P_{BB\_ref}}{P_{DIG} \cdot G_{tot}}$$

After the calculation of $G_{LNA}$ and $G_{DIG}$ the AGC controller 48 applies the updated gains to LNA 12 and the Scalers 34 and 36.

According to one embodiment of the present invention, the power of the required channel for a full allocation of resource blocks, RB $P_{FULL}$, may be calculated based on the $P_{PCPs-c}$ power measured by PCP Power Estimator 38 in the frequency domain. This power $P_{FULL}$ may then be used for calculating the control powers $P_a$ and $P_{DIG}$. Therefore, the AGC system may be able to predict the variation of the power of the required channel and avoid fast switching of the receiver gain.

In some embodiments of the present invention, the AGC system avoids the saturation in the receiver in the presence of a strongly interfering signal by calculating the LNA gain based on an analog control power Pa that is calculated based on the highest measured blocking signal power $P_{Bloc\_max}$, in combination with the power expected if all resource blocks have been allocated, $P_{FULL}$ and by calculating the Scaler gain $G_{DIG}$ based on digital control power $P_{DIG}$ that is calculated by taking the greater value of the NBPM power measurement result $P_{NBPM\_max}$ and the power expected if all resource blocks have been allocated $P_{FULL}$.

Embodiments of the present invention may provide one or more of the following advantages: a stable gain setting may be maintained in the receiver independent of the data allocation; an optimum gain setting may be maintained in the receiver even when a Blocker signal is present; and the use of sliding window power measurements may in an initial synchronization mode may provide an accurate measurement of the maximum signal power measurement for any one sub-frame.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It is noted that embodiments may be implemented within mobile devices or mobile terminals operating in EUTRAN wireless communication systems. However embodiments of the present invention are applicable to any other suitable type of apparatus suitable for communication via access systems. A mobile device may be configured to enable use of different access technologies, for example, based on an appropriate multi-radio implementation.

It is also noted that although certain embodiments were described above by way of example with reference to the exemplifying architectures of certain mobile networks and a wireless local area network, embodiments may be applied to apparatus operating within other suitable forms of communication systems other than those illustrated and described herein. It is also noted that the term access system is understood to refer to any access system configured for enabling wireless communication for user accessing applications.

The above described operations may require data processing in the various entities. The data processing may be provided by means of one or more data processors. Similarly various entities described in the above embodiments may be implemented within a single or a plurality of data processing entities and/or data processors. Appropriately adapted computer program code product may be used for implementing the embodiments, when loaded to a computer. The program code product for providing the operation may be stored on and provided by means of a carrier medium such as a carrier disc, card or tape. A possibility is to download the program code product via a data network. Implementation may be provided with appropriate software in a server.

For example the embodiments of the invention may be implemented as a chipset, in other words a series of integrated circuits communicating among each other. The chipset may comprise microprocessors arranged to run code, application specific integrated circuits (ASICs), or programmable digital signal processors for performing the operations described above.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method comprising:
   amplifying a received signal in an amplifier to create an amplified signal;
   filtering the amplified signal;
   calculating a power of permanent common pilot sub-carriers present in the filtered amplified signal;
   determining a wideband power measurement based on the amplified signal;
   determining a narrowband power measurement based on the filtered amplified signal;
   controlling a first gain for the amplifier in dependence on the calculated power of the permanent common pilot sub-carriers, the narrowband power measurement and a characteristic of the amplified signal including the wideband power measurement;
   amplifying the filtered amplified signal in a further amplifier; and
   controlling a second gain for said further amplifier in dependence on the calculated power of the permanent common pilot sub-carriers, the wideband power measurement and the narrowband power measurement.

2. The method of claim 1, wherein controlling said first gain further comprises:
   controlling said first gain in dependence on a maximum symbol power in a sub-frame of said amplified signal; and
   controlling said second gain further comprises controlling said second gain in dependence on a maximum symbol power in a sub-frame of said received signal and on a maximum symbol power in a sub-frame of said filtered amplified signal.

3. The method of claim 1, wherein said characteristic of the amplified signal is dependent on a maximum symbol power in a sub-frame of the amplified signal.

4. The method of claim 1, wherein said controlling a first gain further comprises determining a difference between said characteristic of the amplified signal and a characteristic of the filtered amplified signal.

5. The method of claim 1, wherein
   said controlling a first gain further comprises determining a maximum expected value of said amplified signal, based on a maximum value of said difference between said characteristic of the amplified signal and characteristic of the filtered amplified signal, and an average power of a permanent common pilot of pilot symbols in said filtered amplified signal; and
   said controlling a second gain further comprises controlling said second gain in dependence on a maximum expected value of said filtered amplified signal and an average power of the permanent common pilot of pilot symbols in said filtered amplified signal.

6. An apparatus comprising:
   an amplifier configured to amplify a received signal to create an amplified signal;
   a filter configured to filter the amplified signal and generate a filtered amplified signal;
   a further amplifier configured to amplify said filtered amplified signal;
   a processor configured to calculate a power of permanent common pilot sub-carriers present in the filtered amplified signal,
   configured to measure a power of said amplified signal,
   configured to measure a power of said filtered amplified signal,
   configured to control a first gain for said amplifier in dependence on the power of permanent common pilot sub-carriers of said filtered amplified signal, the measured power of said filtered amplified signal and a characteristic of the amplified signal including the measured power of said amplified signal, and
   configured to control a second gain for said further amplifier in dependence on the measured power of the amplified signal, the measured power of said filtered amplified signal and the power of permanent common pilot sub-carriers of said filtered amplified signal.

7. The apparatus of claim 6, wherein said processor is further configured to control said first gain in dependence on a maximum symbol power in a sub-frame of said amplified signal and control said second gain in dependence on a maximum symbol power in a sub-frame of said amplified signal and on a maximum symbol power in a sub-frame of said filtered amplified signal.

8. The apparatus of claim 6, wherein said processor is configured to measure the power of one or more reference portions of the amplified signal.

9. The apparatus of claim 6, wherein the processor is configured to receive the output of said further amplifier and estimate an average power of permanent common pilot of pilot symbols of said filtered amplified signal.

10. The apparatus of claim 9, wherein said processor is further configured to control said first gain in dependence on a difference between said characteristic of the amplified signal and a characteristic of the filtered amplified signal.

11. The apparatus of claim 10, wherein said processor is further configured to determine a maximum expected value of said amplified signal based on a maximum value of said difference between said characteristic of the amplified signal and said characteristic of said filtered amplified signal and on said average power of permanent common pilot of the pilot symbols in said filtered amplified signal.

12. The apparatus of claim 9, wherein said processor is further configured to control said second gain in dependence on a maximum expected value of said filtered amplified signal and said average power of permanent common pilot of said pilot symbols in said filtered amplified signal.

13. The apparatus of claim 6, further comprising an analog-to-digital converter configured to sample said amplified signal, and to provide said samples of the amplified signal to said filter; wherein said characteristic of the amplified signal comprises a characteristic of the sampled amplified signal.

14. A non-transitory computer readable memory storing a program of computer executable instructions that when executed by a processor result in actions comprising:
    amplifying a received signal in an amplifier to create an amplified signal;
    filtering the amplified signal;
    calculating a power of permanent common pilot sub-carriers present in the filtered amplified signal;
    determining a wideband power measurement based on the amplified signal;
    determining a narrowband power measurement based on the filtered amplified signal;
    controlling a first gain for the amplifier in dependence on the power of permanent common pilot sub-carriers of the filtered amplified signal, the wideband power measurement and the narrowband power measurement;
    amplifying the filtered amplified signal in a further amplifier; and
    controlling a second gain for said further amplifier in dependence on the calculated power of the permanent common pilot sub-carriers, the wideband power measurement and the narrowband power measurement.

15. An apparatus comprising:
    amplifying means for amplifying a received signal and creating an amplified signal;
    filtering means for filtering the amplified signal;
    further amplifying means for amplifying said filtered amplified signal;
    a processor configured for calculating a power of permanent common pilot sub-carriers present in the filtered amplified signal,
    configured for measuring a power of said amplified signal,
    configured for measuring a power of said filtered amplified signal;
    and configured for controlling a gain for said amplifying means in dependence the power of permanent common pilot sub-carriers of said filtered amplified signal, the measured power of said filtered amplified signal and the measured power of said amplified signal, and
    configured to control a second gain for said further amplifier in dependence on the measured power of the amplified signal, the measured power of said filtered amplified signal and the power of permanent common pilot sub-carriers of said filtered amplified signal.

16. The method of claim 1, wherein the power of the permanent common pilot sub-carriers are calculated in the frequency domain.

17. The apparatus of claim 6, wherein the power of the permanent common pilot sub-carriers are calculated in the frequency domain.

* * * * *